(12) United States Patent
Hashimoto et al.

(10) Patent No.: US 6,266,749 B1
(45) Date of Patent: Jul. 24, 2001

(54) ACCESS TIME MEASUREMENT CIRCUIT AND METHOD

(75) Inventors: Masashi Hashimoto, Ibaraki (JP); James N. Hall, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/041,264

(22) Filed: Mar. 12, 1998

Related U.S. Application Data

(60) Provisional application No. 60/041,091, filed on Mar. 14, 1997.

(51) Int. Cl.$^7$ .................................................. G06F 11/00
(52) U.S. Cl. ............................................ 711/167; 714/721
(58) Field of Search ..................... 714/738, 731, 714/735, 744; 365/201, 233; 711/167

(56) References Cited

U.S. PATENT DOCUMENTS

| | | | |
|---|---|---|---|
| 4,893,072 | * | 1/1990 | Matsumoto ........................... 714/731 |
| 4,965,799 | | 10/1990 | Green et al. ........................ 371/21.2 |
| 5,386,392 | * | 1/1995 | Cantiant et al. ..................... 365/233 |
| 5,396,464 | * | 3/1995 | Slemmer ............................. 365/201 |
| 5,555,209 | * | 9/1996 | Smith et al. ......................... 365/189 |
| 5,640,527 | * | 6/1997 | Pecone et al. ....................... 395/405 |
| 5,664,166 | * | 9/1997 | Isfeld ................................ 395/556 |
| 5,793,685 | * | 8/1998 | Suma ................................. 365/201 |
| 6,081,783 | * | 6/2000 | Divine et al. ....................... 704/500 |

FOREIGN PATENT DOCUMENTS

| | | |
|---|---|---|
| 37 00 251 | 7/1987 | (DE) . |
| 0 260 982 A | 3/1988 | (EP) . |

* cited by examiner

*Primary Examiner*—Albert Decady
*Assistant Examiner*—David Ton
(74) *Attorney, Agent, or Firm*—Robert N. Rountree; Wade James Brady, III; Frederick J. Telecky, Jr.

(57) ABSTRACT

A circuit for measuring the access time of a memory circuit. The circuit includes a storage element 908 having an input terminal, an output terminal, and a clock terminal. The input terminal of the storage element is coupled to an output of the memory circuit 900. A clock signal source 906 is coupled to the clock terminal of the storage element and to a clock terminal of the memory circuit. The circuit also includes test circuitry 902 coupled to address and control terminals of the memory circuit and to the output terminal of the storage element. The test circuitry is operable to store or generate a test data pattern and compare the pattern to data output from the storage element. In one embodiment, the storage element is a data latch comprising a clock-enabled inverter serially coupled with a flip-flop. The flip-flop in one embodiment is a cross-coupled inverter storage cell or "keeper". For a clock signal having a pulse length or duty cycle that is longer than the access time of the memory circuit, the output of the storage element matches the data pattern stored by the test circuitry. As the clock frequency is increased, or the duty cycle decreased, so that the pulse length approximates the access time, the data output from the storage element no longer matches the data expected by the test circuitry, thus allowing a determination of the access time.

33 Claims, 6 Drawing Sheets

ACCESS TIME MEASUREMENT CIRCUIT AND METHOD

This application claims priority under 35 U.S.C. §119(e)(1) of provisional application No. 60/041,091, filed Mar. 14, 1997.

FIELD OF THE INVENTION

This invention generally relates to electronic circuits, and more specifically to semiconductor integrated circuits.

BACKGROUND OF THE INVENTION

The measurement of access time in memory circuits is one of the most difficult items in integrated circuit testing. Access time is generally defined as the delay between the inputting of information to a memory circuit and the presence of valid data at the output of the memory circuit. One common parameter is the address access time, that is, the amount of delay between providing a memory cell address and the availability of the stored data at the output of the circuit. The address access times for static random access memory circuits (SRAMs) and dynamic random access memory circuits (DRAMs) are on the order of tens of nanoseconds. The brevity of the access time parameter is one factor in making the measurement difficult.

Techniques used in the past have typically relied on two or more clock signals to measure access time. This is particularly so for synchronous circuits, that is, memory devices in which the transfer of information into, within, and out of the circuit is coordinated with a clock signal. In one example of an access time measurement using multiple clocks, one clock signal is used to regulate the latching of address information and the propagation of signals within the memory circuit, while a second clock is used to regulate the outputting of data.

The multiple-clock approaches suffer from several problems. For example, die space is consumed by the pads and lines associated with additional clocks. This additional space on an integrated circuit die that is devoted only to testing the integrated circuit is often referred to as "test overhead." In addition, in a system that relies on two or more clocks, the propagation delay differences between the clock signals affect the accuracy of the access-time measurement. A need exists in the industry for a solution to these problems.

SUMMARY OF THE INVENTION

In accordance with a preferred embodiment of the invention, there is disclosed a circuit for measuring the access time of a memory circuit. The circuit includes a storage element having an input terminal, an output terminal, and a clock terminal. The input terminal of the storage element is coupled to an output of the memory circuit. A clock signal source is coupled to the clock terminal of the storage element and to a clock terminal of the memory circuit. The circuit also includes test circuitry coupled to address and control terminals of the memory circuit and to the output terminal of the storage element. The test circuitry is operable to store a test data pattern, or alternatively to generate a test pattern, and compare the pattern to data output from the storage element. In one embodiment, the storage element is a data latch comprising a clock-enabled inverter serially coupled with a flip-flop. The flip-flop in one embodiment is a cross-coupled inverter storage cell or "keeper". For a clock signal having a pulse length or duty cycle that is longer than the access time of the memory circuit, the output of the storage element matches the data pattern stored by the test circuitry. As the clock frequency is increased, or the duty cycle decreased, so that the pulse length approximates the access time, the data output from the storage element no longer matches the data expected by the test circuitry, thus allowing a determination of the access time.

An advantage of the inventive concepts is that an access time measurement is possible using a single clock signal. Thus, test overhead on the integrated circuit is kept to a minimum and problems with differing delays between clock signals are avoided. In addition, no extra package pins or terminals are required by the measurement approach.

BRIEF DESCRIPTION OF THE DRAWINGS

The foregoing features of the present invention may be more fully understood from the following detailed description, read in conjunction with the accompanying drawings, wherein.

DETAILED DESCRIPTION OF PREFERRED EMBODIMENTS

Figure 1:
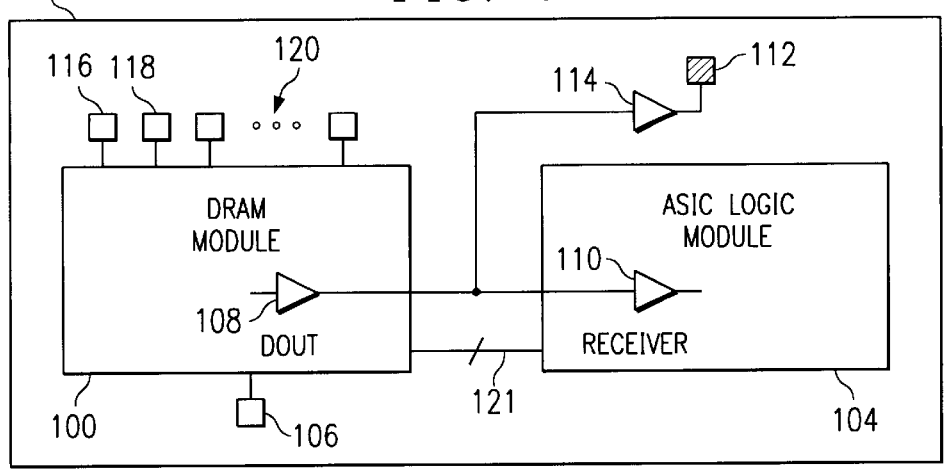
FIG. 1 is a block diagram of an integrated circuit having embedded memory and application, specific logic circuits.

In the embodiments of the invention that follow, an access time measurement is possible with a single clock signal. The techniques may be applied to both synchronous and asynchronous circuits and to DRAMs, SRAMs, and other types of integrated circuits such as those having clocked or synchronous input circuits and flow-through or nonsynchronous output circuits (flash memory and simple adders, for example). FIG. 1 is a block diagram of how a single-clock access-time measurement technique has been applied to an embedded DRAM module. In FIG. 1, DRAM module 100 is integrated on a single semiconductor die 102 with application-specific integrated circuit (ASIC) logic module 104. ASIC module 104 may be a microprocessor, microcontroller, digital signal processor, or other logic circuit. The clock signal used to regulate the transfer of data into, within, and out of the DRAM is provided at clock terminal 106. Buffer driver 108 drives the data out of the DRAM circuit and into the receiver buffer 110 of the ASIC logic module 104. The access time measurement is made by sampling the output at data output monitor terminal 112. The signal from buffer driver 108 is enhanced by a test buffer driver 114.

The circuit of FIG. 1 suffers from several problems. First, as depicted in FIG. 1, it is typical that the receiver buffer of the ASIC logic module 104 is near the middle of the integrated circuit die, while the monitor terminal 112 is near the edge of the die. The distance between the receiver and the monitor terminal causes a signal propagation delay that results in error in the access time measurement. Even more delay in the test signal is induced by the additional driver 114 used to drive the test signal to the test equipment that is coupled to monitor terminal 112.

Figure 2:
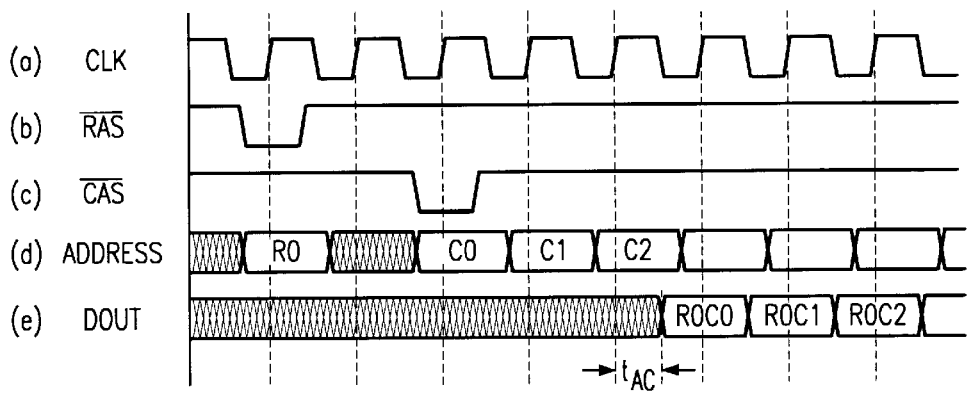
FIG. 2 is a timing diagram showing the synchronous operation of a memory circuit.

FIG. 2 is a timing diagram of a synchronous DRAM. Signal (a) is an external clock signal applied during testing at terminal 106 in FIG. 1, for example. Signals (b) and (c) are the complements of the row address and column address strobes, respectively, applied during testing at terminals 116 and 118 in FIG. 1, for example. Signal (d) is the row and column address information input at a plurality of terminals 120 in FIG. 1, for example. Of course, the DRAM module 100 and ASIC logic module 104 are connected by a bus 121 that carries control and address signals in the operating mode of the integrated circuit where address and control signals are provided to the memory module by the ASIC logic module. Only one row address (R0) and three column addresses (C0, C1, C2) are shown in line (d), but one skilled in the art will appreciate that many more or fewer address bits may be used. The signal in line (e) is the data output of the memory circuit. The first bits of the output (R0C0) are delayed by three clock cycles, hence the CAS latency is three in this example. The delay $t_{AC}$ is the access time of the DRAM. The access time is measured from a rising edge of the clock signal, and is not influenced by a falling clock signal edge.

Figure 3:
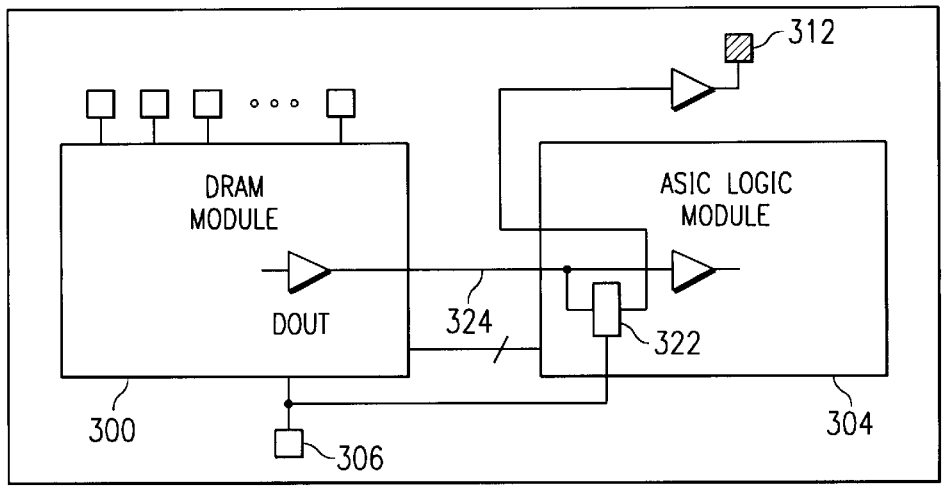
FIG. 3 is a block diagram of a first preferred embodiment circuit.
Figure 4:
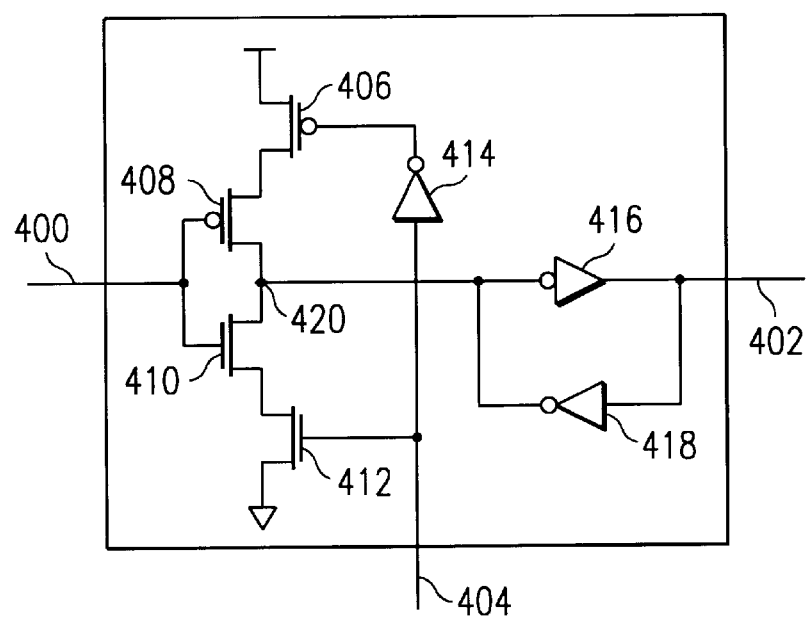
FIG. 4 is a schematic diagram of a latch circuit that may be used in conjunction with the circuit of FIG. 3.

FIG. 3 is a preferred embodiment in accordance with the invention. The block diagram of FIG. 3 is similar to that of FIG. 1, except that storage element or latch 322 is coupled between the output of the DRAM module 300 and the test monitor terminal 312. An example of a latch 322 is shown in FIG. 4. The latch comprises an input terminal 400, an output terminal 402, and a clock terminal 404. P-channel transistor 408 and n-channel transistor 410 form an inverter that is enabled or disabled by transistors 406 and 412 in accordance with a clock signal at terminal 404. Inverters 416 and 418 form a storage cell or flip-flop core (in this embodiment a cross-coupled inverter storage cell) that stores the output of the inverter formed by transistors 408 and 410 until the output changes. The latch may be incorporated in the ASIC logic module 304 or in the DRAM module 300.

In operation, when the clock signal at terminal 404 is a logic high voltage, transistors 406 and 412 are conductive and the transistors 408 and 410 act as a conventional inverter. For example, a logic high input at terminal 400 produces a logic low output at node 420. For a logic low input at terminal 400, the output at node 420 is a logic high. The signal at node 420 is stored by the storage cell that comprises inverters 416 and 418. The signal is retained by the storage cell until the logic level at node 420 changes. Inverter 416 also inverts the signal at node 420 such that a high logic level input at terminal 400, for example, produces a high logic level output at output terminal 402. The output terminal 402 remains at the high logic level until a low logic level appears at input terminal 400. When the clock signal is a logic low voltage, transistors 406 and 412 are nonconductive, thus tri-stating node 420. Therefore, during the low-voltage portion of the clock cycle, the output of the latch remains the same as the last data at the input terminal 400 during the logic high voltage portion of the clock cycle.

Figure 5:
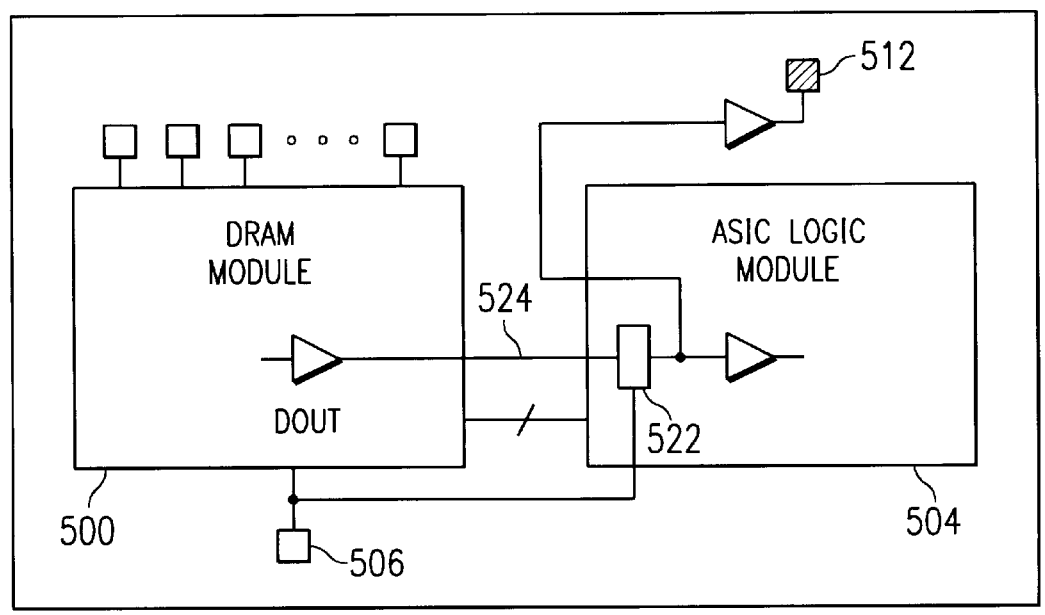
FIG. 5 is block diagram of an alternative approach to that shown in FIG. 3.
Figure 6A:
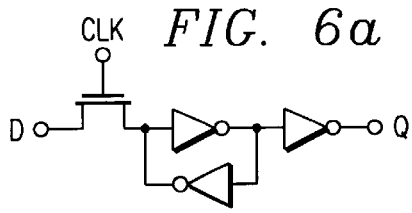
FIGS. 6a–6f are alternative latch schemes to that shown in FIG. 4.
Figure 6B:
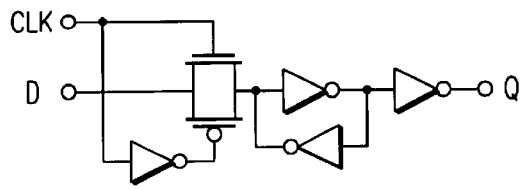
Figure 6C:
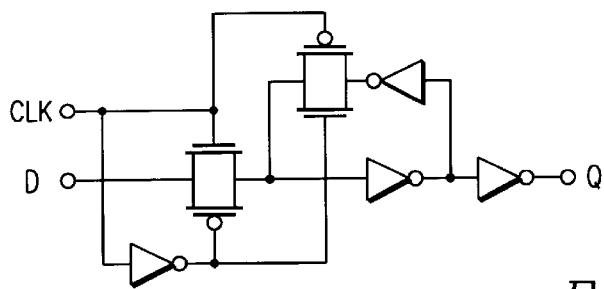
Figure 6D:
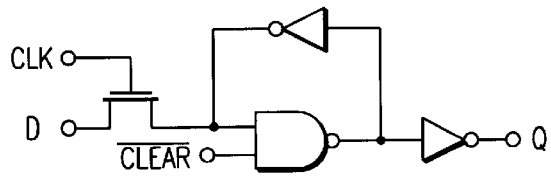
Figure 6E:
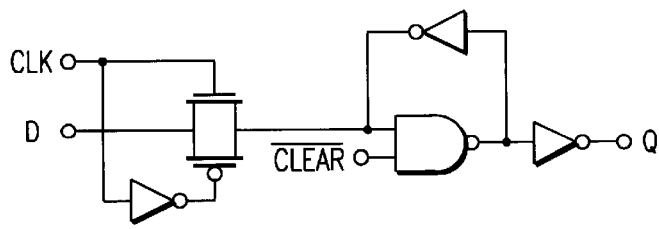
Figure 6F:
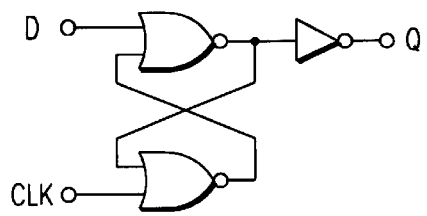

A feature of the latch shown in FIG. 4 is that it is made transparent by holding the voltage on the clock terminal 404 at a logic high. In this condition, a signal encounters only slight delay in passing through the latch. The latch can also be inactivated when the integrated circuit is in operating mode rather than test mode. By simply holding the clock terminal 404 at a logic low, the transistors 406 and 412 are inactivated, thereby disabling the inverter formed by transistors 408 and 410. This feature allows the portions of the integrated circuit of FIG. 3 that are associated only with the testing of the circuit to be disabled so as to not interfere with the normal operations of the integrated circuit and to prevent unnecessary dissipation of power in the test circuits. The feature of the latch being transparent when the clock terminal is held at a logic high makes possible the alternative embodiment shown in FIG. 5. In FIG. 3, the latch occupies a shunt position relative to the memory module output 324. In FIG. 5, however, the latch is in the data path from the memory module 500 to the ASIC logic module 504. With the clock terminal 404 of the latch held at a logic high, the latch passes the data 524 with only slight delay. Holding the clock terminal low interrupts a data transfer on line 524.

One skilled in the art will appreciate that many comparable latches may be used other than the one shown in FIG. 4. Examples of alternatives include those shown in FIGS. 6a through 6f.

Figure 7A:
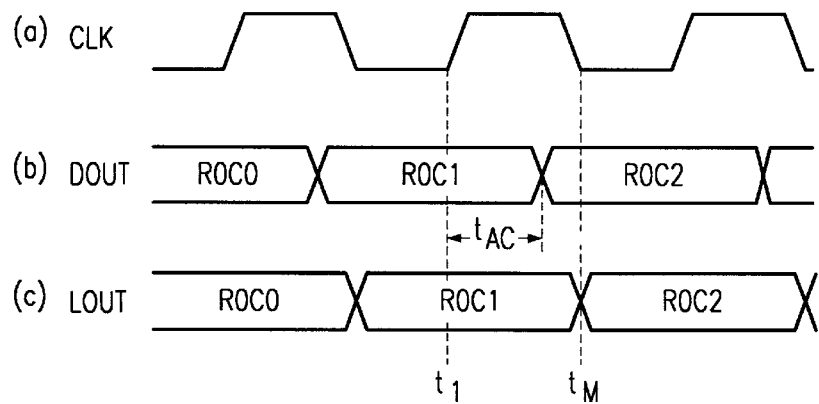
FIGS. 7a to 7c are timing diagrams showing operation of the embodiment measurement technique.
Figure 7B:
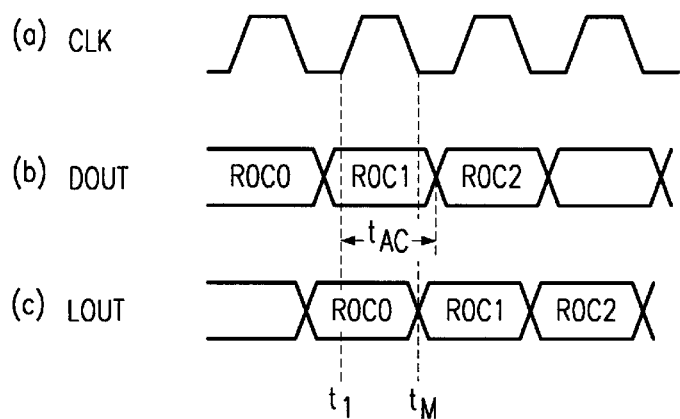
Figure 7C:
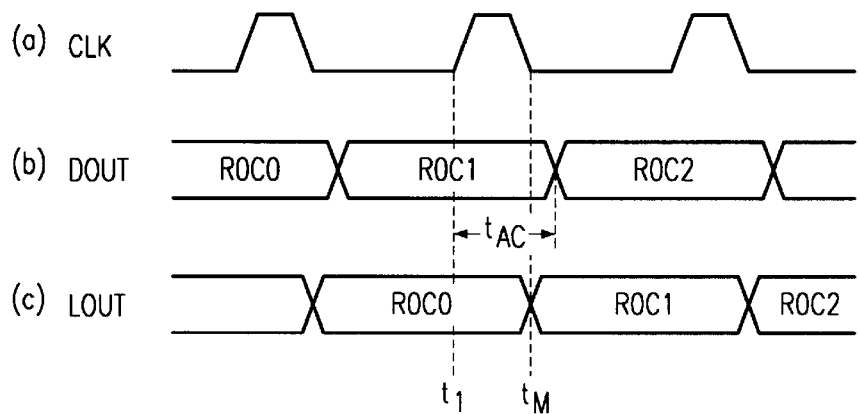

The operation of the circuit of FIG. 3 may be better understood by referring to FIGS. 7a, 7b, and 7c. In FIG. 7a, line (a) is the clock signal supplied at terminal 306 in FIG. 3, for example. Line (b) is the data output of the DRAM module 300. Once a request is made of the memory module to provide data from a particular cell, a delay of $t_{AC}$ (the access time of the memory) elapses before the data appears at the output 324 of the memory module. For example, in FIG. 7a the address for location R0C2 is given to the memory module when the rising edge of the clock signal occurs at time $t_1$. Time $t_{AC}$ elapses before the data for R0C2 appears at the output of the memory module. But since the falling edge of the clock signal occurs after the transition in line (b) from the R0C1 data location to the R0C2 data location, the latch 322 stores the current value of Dout on the falling edge of the clock cycle. In this example, the data Dout at the falling edge of the clock pulse that begins at ti is R0C2. Hence, in the situation shown in FIG. 7a where the portion of the clock cycle that is a logic high voltage exceeds the access time period, the output of the latch 322, Lout, reflects the current value at the monitor point, $t_M$, of the data output from the memory module 300.

Figure 8A:
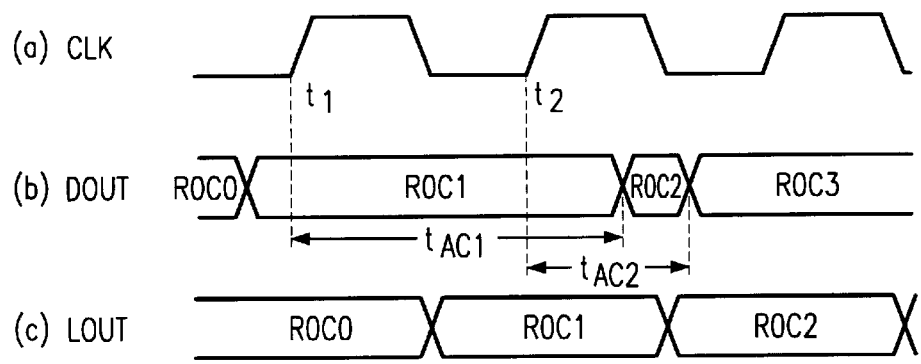
FIGS. 8a to 8c are timing diagrams showing operation of the embodiment measurement technique for very nonuniform memory cell access times.
Figure 8B:
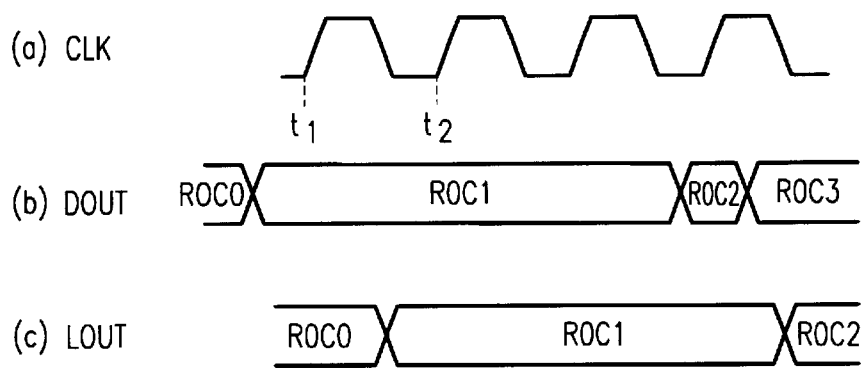
Figure 8C:
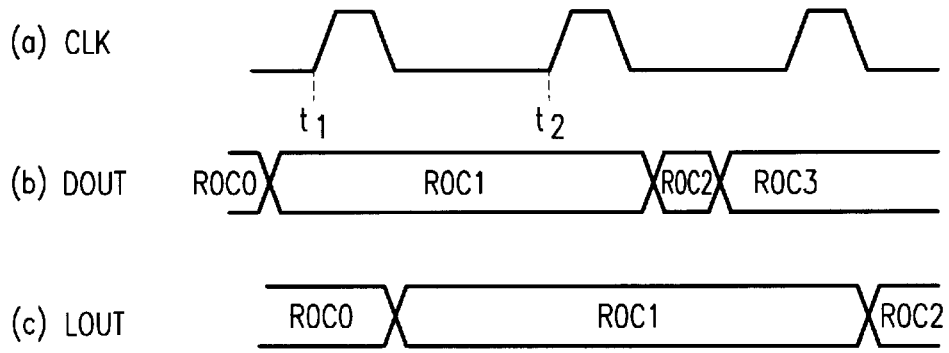

In contrast, in FIG. 7b a situation is shown in which the circuit of FIG. 3 is clocked at a frequency in which the logic high portion of the clock cycle is shorter than the access times of the cells in the memory module. Therefore, at the falling edge of the clock pulse that begins at $t_1$, the data for R0C1 still appears at the output even though the data for R0C2 was requested at time $t_1$. Since the falling edge of the clock occurs when R0C1 was at the input to latch 322, R0C1 is stored until the clock goes low with R0C2 on the latch input. In summary, when the clock frequency is fast enough that the logic high portion of the clock cycle (the clock pulse) is shorter than the memory access time, the latch stores the data of the previous requested memory location. But when the pulse length is longer than the memory access time, the latch stores the data of the currently requested memory location (when Dout and Lout are compared at time $t_M$). This is true for locations having relatively uniform access times. FIGS. 8a to 8c show a situation where cell access times are nonuniform.

FIG. 7c illustrates that a similar result to that in FIG. 7b can be obtained by simply decreasing the duty cycle of the clock pulse while keeping the clock frequency constant. As in FIG. 7b, the falling edge of the pulse that begins at ti occurs when R0C1 is active on line (b), even though the R0C2 data was requested at time $t_1$.

FIGS. 7a to 7c show a situation where the access times of the memory cell locations R0C0, R0C1, and R0C2 are approximately equal. Thus, in FIGS. 7b and 7c, all of the Lout data for cell locations R0C0, R0C1, and R0C2 is out of phase with the Dout data for the clock frequency variation shown in FIG. 7b and for the clock duty cycle variation shown in FIG. 7c. Even though all of the latched data for R0C0, R0C1, and R0C2 is out of phase with the Dout data, all of the Dout data is latched. The situation is different when the access times for data locations are substantially different.

FIGS. 8a to 8c show a situation where the access times of the memory cell locations are not approximately equal. Specifically, in line (b) of FIG. 8a, the access time, $t_{AC1}$, of cell R0C2 is much longer than the access time, $t_{AC2}$, of cell R0C3. At the frequency and duty cycle of the clock signal in line (a), inspection of line (c) shows that all of the data, Dout, in line (b) is latched. A comparison of the phases of the Dout and Lout datastreams, however, may not be as valuable as in the situation described in FIGS. 7a to 7c where the access times of the data cells were relatively uniform. As can be seen in FIGS. 8b and 8c, when the clock frequency is increased (FIG. 8b) or the duty cycle decreased (FIG. 8c), not all of the Dout data is latched. Indeed, the access time, $t_{AC1}$, of location R0C2 is long enough and the access time of location R0C3 is short enough that the data for R0C2 is not latched. Thus, the sequence of Lout data in FIG. 8b is R0C0, R0C1, R0C3, rather than R0C0, R0C1, R0C2, R0C3 as shown in FIG. 8a. FIG. 8c shows that a similar result can be obtained by decreasing the duty cycle of the clock signal while holding the frequency constant.

Figure 9:
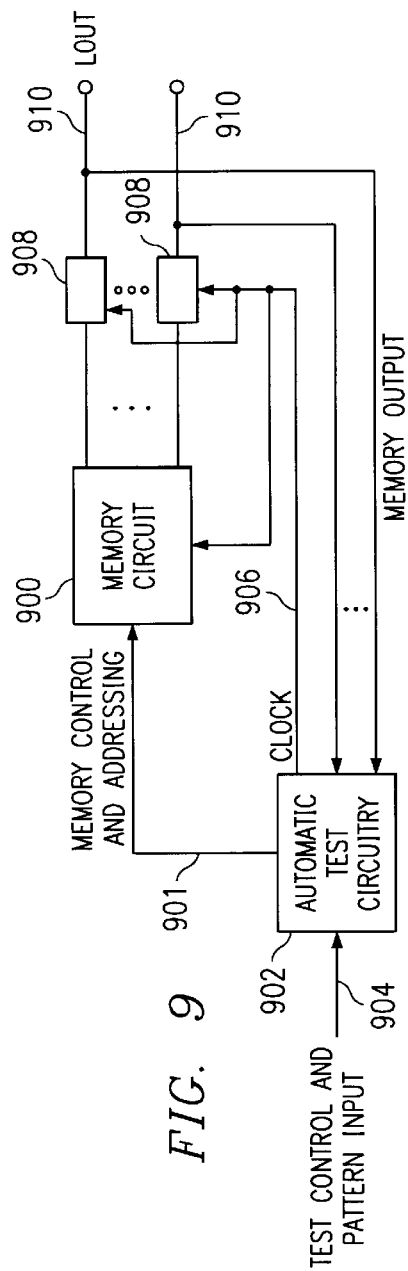
FIG. 9 is a block diagram of an embodiment test circuit.

The phenomena described above can be used to measure access time. An embodiment block diagram of a test system to measure access time is shown in FIG. 9. One skilled in the art will appreciate that testing can be accomplished with test circuitry external to the integrated circuit or with built-in self test (BIST) circuitry on the same semiconductor die as the circuit to be tested. The automatic test circuitry 902, whether external to the integrated circuit or configured on the integrated circuit as BIST circuitry, is loaded with a data test pattern (alternating 0s and 1s, for example) at terminal 904 so that the tester can expect a particular data output for a particular memory address. The skilled artisan will also appreciate that the test circuitry can generate the test pattern data as needed, rather than retrieve a stored test data pattern as described above. The memory circuit 900 is loaded with the same data pattern that is either generated by or loaded into the test circuitry along line 901.

In one approach, the frequency of the clock signal on line 906 supplied by the test circuitry to the memory circuit 900 and to the latches 908 associated with each output terminal of the memory circuit is then set to toggle at a frequency low enough to ensure that the falling edge of the clock signal occurs after the access time has elapsed, as in the situation described above in FIG. 7a. Alternatively, the test circuitry could set the duty cycle of the clock signal to ensure that the falling edge occurs after the access time has elapsed. As the test circuit reads the Lout data from the latches at terminals 910, it compares that output data to the test pattern loaded prior to the test or to the pattern generated by the test circuit itself. Since the clock frequency is relatively low or the duty cycle relatively long, the output data should correspond at a given point in the clock cycle ($t_M$) with the data expected for the addresses chosen by the test circuitry because the access time of the memory circuit is less than the duration of the clock pulse (see FIG. 7a). As the clock frequency is increased or the duty cycle decreased, however, the pulse length begins to approach the access time of the memory. When this occurs, the Lout data from the latch begins to correspond not with the data expected by the test circuitry, but instead to the previous data values in the pattern, as described above with reference to FIGS. 7b and 7c (the latched data, Lout, can also skip Dout data as described below with reference to FIGS. 8a, 8b, and 8c). The access time of the memory is thus equal to the logic high portion of the clock cycle (the pulse length) at which current data is no longer detected by the test circuitry.

In another approach, the clock signal on line 906 supplied by the test circuitry to the memory circuit 900 and to the latches 908 associated with each output terminal of the memory circuit is again set to toggle at a frequency low enough to ensure that the all of the data, Dout, is latched as Lout data as described above in FIG. 8a. Alternatively, the test circuitry could set the duty cycle of the clock signal to ensure that the falling edge occurs after the access time has elapsed. As the test circuit reads the Lout data from the latches at terminals 910, it compares that output data to the test pattern loaded prior to the test or to the pattern generated by the test circuit itself. Since the clock frequency is relatively low or the duty cycle relatively long, the output data should correspond sequentially with the data expected for the addresses chosen by the test circuitry (see FIG. 8a). As the clock frequency is increased or the duty cycle decreased, however, the pulse length begins to approach the worst case access time of the memory. When this occurs, the Lout data from the latch differs from the Dout data (see FIGS. 8b and 8c). The access time of the memory can then be determined from the pulse width or clock frequency at which the difference in Dout and Lout occurred.

This approach to access time measurement requires no complex control circuitry. The same clock signal is used for both the memory module operation and the Dout latch operation. No additional clock or accompanying circuitry is required as is the case with prior art approaches. Thus, test overhead on the integrated circuit is kept to a minimum and problems with differing delays between clock signals are avoided. In addition, no extra package pins or terminals are required.

Figure 10:
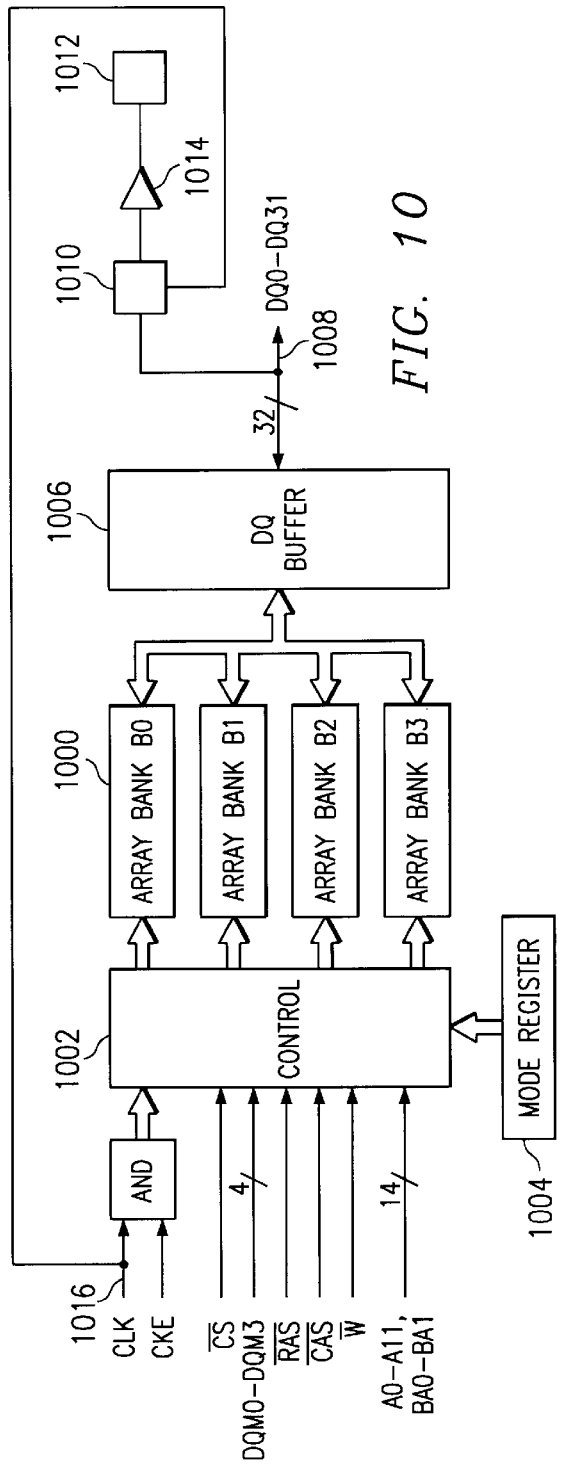
FIG. 10 is a block diagram of an embodiment memory integrated circuit.

The embodiments described above relate to a memory circuit embedded in an integrated circuit with a complex logic circuit. The same concepts can of course be applied to a discrete memory integrated circuit. Another preferred embodiment in accordance with the invention is shown in FIG. 10. FIG. 10 is a block diagram of a 256 Mb synchronous DRAM having memory cells arranged in four banks 1000. The control and addressing of the DRAM is performed by control circuit block 1002. Latency, burst length, and data output format is controlled by the mode register 1004. In this embodiment, the output 1006 is thirty-two bits wide. The access-time test approach applied in the embodiments above is also applied here. Associated with each of the thirty-two output lines 1008 (shown in FIG. 10 as a single line for simplicity) is a latch 1010, and a test terminal 1012. A buffer driver 1014 may also be included to enhance the output signals. Only one set of the latch, test terminal, and buffer driver is shown in FIG. 10, but it should be noted that each output line is coupled to a similar set of circuit elements. The clock signal that controls the operation of the memory circuit at terminal 1016 is coupled by line 1018 to latch 1010 to synchronize the latching of output data with memory operation. The access time test is performed as described above with reference to the embedded memory circuit.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A circuit comprising:
    a clock terminal coupled to receive a clock signal having a first edge corresponding to a transition from a first logic state to a second logic state and having a second edge corresponding to a transition from the second logic state to the first logic state, the clock signal having a variable time between the first edge and the second edge;
    a memory circuit coupled to the clock terminal and having a data terminal, the memory circuit arranged to receive and produce data at the data terminal in synchronization with the clock signal; and
    a storage element coupled to the clock terminal, the data terminal, and a monitor terminal, the monitor terminal arranged for external connection, the storage element arranged to store data from the data terminal in response to the first edge and to not store data from the data terminal in response to the second edge.

2. A circuit as in claim 1, wherein the clock terminal, the memory circuit, and the storage element comprise a single integrated circuit.

3. A circuit as in claim 2, wherein the memory circuit is a dynamic random access memory circuit.

4. A circuit as in claim 2, wherein the single integrated circuit further comprises a digital processor coupled to the storage element.

5. A circuit as in claim 1, wherein the memory circuit produces the data in response to the first edge, and wherein the variable time to the second edge determines an access time.

6. A circuit as in claim 1, wherein the storage element comprises:
    a first inverting circuit having a first input terminal coupled to receive the data at the data terminal and having a first output terminal; and
    a second inverting circuit having a second input terminal coupled to the first output terminal and having a second output terminal coupled to the first input terminal.

7. A circuit as in claim 6, further comprising a transmission gate having a control terminal coupled to the clock terminal, having an input terminal coupled to the data terminal, and having an output terminal coupled to the first input terminal.

8. A circuit as in claim 1, wherein the memory circuit comprises a plurality of memory cells arranged in rows and columns and wherein the data at the data terminal comprises a sequence of data bits from a single row and a plurality of columns.

9. A circuit as in claim 8, wherein the sequence of data bits comprises alternating ones and zeros.

10. An integrated circuit comprising:
    a clock terminal coupled to receive a clock signal having a first edge corresponding to a transition from a first logic state to a second logic state and having a second edge corresponding to a transition from the second logic state to the first logic state, the clock signal having a variable time between the first edge and the second edge;
    a memory circuit coupled to the clock terminal and having a data terminal, the memory circuit arranged to produce data at the data terminal in synchronization with the clock signal;
    a storage element coupled to the clock terminal and the data terminal, the storage element arranged to store data from the data terminal in response to the first edge and to not store data from the data terminal in response to the second edge; and
    a processor circuit having an input terminal coupled to receive the data at the data terminal.

11. A circuit as in claim 10, wherein the memory circuit is a dynamic random access memory circuit.

12. A circuit as in claim 10, wherein the processor circuit comprises a digital signal processor.

13. A circuit as in claim wherein the 10, processor circuit comprises a microprocessor.

14. A circuit as in claim 10, wherein the memory circuit produces the data in response to the first edge, and wherein the variable time to the second edge determines an access time.

15. A circuit as in claim 10, wherein the storage element comprises:
    a first inverting circuit having a first input terminal coupled to receive the data at the data terminal and having a first output terminal; and
    a second inverting circuit having a second input terminal coupled to the first output terminal and having a second output terminal coupled to the first input terminal.

16. A circuit as in claim 15, further comprising a transmission gate having a control terminal coupled to the clock terminal, having an input terminal coupled to the data terminal, and having an output terminal coupled to the first input terminal.

17. A circuit as in claim 10, wherein the memory circuit comprises a plurality of memory cells arranged in rows and columns and wherein the data at the data terminal comprises a sequence of data bits from a single row and a plurality of columns.

18. A circuit as in claim 17, wherein the sequence of data bits comprises alternating ones and zeros.

19. A circuit coupled to receive a plurality of timing edges corresponding to respective transitions between logic states, the circuit comprising:
    a digital processor formed at a face of an integrated circuit;
    a memory circuit formed at the face of the integrated circuit arranged to exchange data with the digital processor and coupled to receive a first timing edge, the memory circuit arranged to produce data at the data terminal in synchronization with the first timing edge; and
    a storage element coupled to the data terminal, the storage element coupled to receive a second timing edge, the storage element arranged to store the data at the data terminal at a time after the first timing edge and before the second timing edge and to not store the data at the data terminal in response to the second timing edge, wherein a time between the first timing edge and the second timing edge is variable.

20. A circuit as in claim 19, wherein the memory circuit is a dynamic random access memory circuit.

21. A circuit as in claim 19, wherein the digital processor is a digital signal processor.

22. A circuit as in claim 19, wherein the memory circuit produces the data in response to the first timing edge, and wherein the variable time to the second timing edge determines an access time of the memory circuit.

23. A circuit as in claim 19, wherein the storage element comprises:
   a first inverting circuit having a first input terminal coupled to receive the data at the data terminal and having a first output terminal; and
   a second inverting circuit having a second input terminal coupled to the first output terminal and having a second output terminal coupled to the first input terminal.

24. A circuit as in claim 23, further comprising a transmission gate having a control terminal coupled to receive the first timing edge, having an input terminal coupled to the data terminal, and having an output terminal coupled to the first input terminal.

25. A circuit as in claim 19, wherein the memory circuit comprises a plurality of memory cells arranged in rows and columns and wherein the data at the data terminal comprises a sequence of data bits from a single row and a plurality of columns.

26. A circuit as in claim 25, wherein the sequence of data bits comprises alternating ones and zeros.

27. A circuit as in claim 19, wherein the first timing edge and the second timing edge are different edges of a clock signal.

28. A circuit as in claim 19, wherein the first timing edge and the second timing edge are sequential edges of a clock signal.

29. A method of measuring an access time of an integrated circuit having a memory circuit and a processor circuit with timing edges corresponding to transitions between logic states, the method comprising the steps of:
   reading data from the memory circuit to the processor circuit;
   writing data to the memory circuit from the processor circuit;
   reading data from them memory circuit in response to a first timing edge;
   storing the data in a storage element at a time after the first timing edge and before the second timing edge;
   not storing the data in the storage element at a time after the second timing edge; and
   changing a time between the first timing edge and the second timing edge to determine the access time of the memory circuit.

30. A method of measuring an access time as in claim 29, further comprising the steps of:
   addressing a row of memory cells in the memory circuit;
   writing the data as a pattern of alternating ones and zeros in the row of memory cells; and
   determining the access time when at least two adjacent bits of the pattern have the same logic state.

31. A method of measuring an access time as in claim 29, further comprising the steps of:
   addressing a row of memory cells in the memory circuit;
   writing the data as a pattern of ones and zeros in the row of memory cells; and
   determining the access time by comparing the pattern to the known pattern.

32. A method of measuring an access time as in claim 29, wherein the first timing edge and the second timing edge are sequential edges of a clock signal.

33. A method of measuring an access time as in claim 29, wherein the first timing edge and the second timing edge are different edges of a clock signal.

* * * * *